(12) United States Patent
Parker

(10) Patent No.: US 7,122,795 B2
(45) Date of Patent: Oct. 17, 2006

(54) DETECTOR OPTICS FOR CHARGED PARTICLE BEAM INSPECTION SYSTEM

(75) Inventor: N. William Parker, Fairfield, CA (US)

(73) Assignee: Multibeam Systems, Inc., Santa Clara, CA (US)

( * ) Notice: Subject to any disclaimer, the term of this patent is extended or adjusted under 35 U.S.C. 154(b) by 0 days.

(21) Appl. No.: 10/833,949

(22) Filed: Apr. 27, 2004

(65) Prior Publication Data

US 2005/0001165 A1 Jan. 6, 2005

Related U.S. Application Data

(63) Continuation-in-part of application No. 10/126,943, filed on Apr. 18, 2002, now Pat. No. 6,777,675.

(60) Provisional application No. 60/338,579, filed on Apr. 18, 2001.

(51) Int. Cl.
*G01N 23/00* (2006.01)

(52) U.S. Cl. .................................... 250/310; 250/397

(58) Field of Classification Search ................ 250/310
See application file for complete search history.

(56) References Cited

U.S. PATENT DOCUMENTS

| | | | |
|---|---|---|---|
| 4,011,450 A | 3/1977 | Tagawa et al. | 250/311 |
| 4,390,789 A | 6/1983 | Smith et al. | 250/492.2 |
| 4,430,571 A | 2/1984 | Smith et al. | 250/492.2 |
| 4,661,709 A | 4/1987 | Harte | 250/396 R |
| 4,694,178 A | 9/1987 | Harte | 250/396 R |
| 4,724,328 A | 2/1988 | Lischke | 250/492.2 |
| 4,742,234 A | 5/1988 | Feldman et al. | 250/492.2 |
| 4,902,898 A | 2/1990 | Jones et al. | 250/492.2 |
| 4,918,358 A * | 4/1990 | Aihara et al. | 315/111.81 |
| 4,996,441 A | 2/1991 | Lischke | 250/492.2 |
| 5,363,021 A | 11/1994 | MacDonald | 315/366 |
| 5,384,463 A | 1/1995 | Honjo et al. | 250/398 |
| 5,430,292 A | 7/1995 | Honjo et al. | 250/310 |
| 5,502,306 A | 3/1996 | Meisburger et al. | 250/310 |
| 5,557,105 A | 9/1996 | Honjo et al. | 250/310 |
| 5,578,821 A | 11/1996 | Meisburger et al. | 250/310 |
| 5,578,822 A | 11/1996 | Van Der Mast et al. | 250/310 |
| 5,661,307 A | 8/1997 | Nakasuji | 250/492.2 |

(Continued)

FOREIGN PATENT DOCUMENTS

WO WO 98/48443 10/1998

OTHER PUBLICATIONS

Hendricks et al., SPIE vol. 2439 pp. 175-183, 1995. (Abstract only attached.).

*Primary Examiner*—Nikita Wells
*Assistant Examiner*—Phillip A. Johnston
(74) *Attorney, Agent, or Firm*—David H. Jaffer; Pillsbury Winthrop Shaw Pittman LLP

(57) ABSTRACT

A charged particle beam column for substrate inspection includes detector optics with high secondary electron detection efficiency combined with minimal distortion of the charged particle beam. One embodiment of the detector optics includes a symmetrizing electrode configured with a secondary electron detector to produce a generally cylindrically symmetric electric field about the optical axis of the column. Control electrodes may be used for screening the charged particle beam from the secondary electron detector and for controlling the electric field at the surface of the substrate. In some embodiments, the control electrodes are cylindrically symmetric about the optical axis; whereas in other embodiments, the cylindrical symmetry of one or more control electrodes is broken in order to improve the secondary electron detection efficiency.

22 Claims, 12 Drawing Sheets

U.S. PATENT DOCUMENTS

| | | | |
|---|---|---|---|
| 5,717,204 A | 2/1998 | Meisburger et al. | 250/310 |
| 5,892,224 A | 4/1999 | Nakasuji | 250/310 |
| 5,981,962 A | 11/1999 | Groves et al. | 250/492.23 |
| 6,023,060 A | 2/2000 | Chang et al. | 250/310 |
| 6,157,039 A | 12/2000 | Mankos | 250/492.2 |
| 6,236,053 B1 | 5/2001 | Shariv | 250/397 |
| 6,252,412 B1 | 6/2001 | Talbot et al. | 324/750 |
| 6,465,783 B1 | 10/2002 | Nakasuji | 250/311 |
| 6,509,750 B1 | 1/2003 | Talbot et al. | 324/750 |
| 6,552,353 B1 | 4/2003 | Muraki | 250/492.2 |
| 6,617,587 B1 | 9/2003 | Parker et al. | 250/398 |
| 6,734,428 B1 | 5/2004 | Parker et al. | 250/310 |
| 2001/0032939 A1 | 10/2001 | Gerlach et al. | 250/492.3 |
| 2002/0015143 A1 | 2/2002 | Yin et al. | 355/133 |
| 2002/0117967 A1 | 8/2002 | Gerlach et al. | 315/13.1 |
| 2003/0001095 A1 | 1/2003 | Lo et al. | 250/346 |
| 2003/0066963 A1 | 4/2003 | Parker et al. | 250/310 |

\* cited by examiner

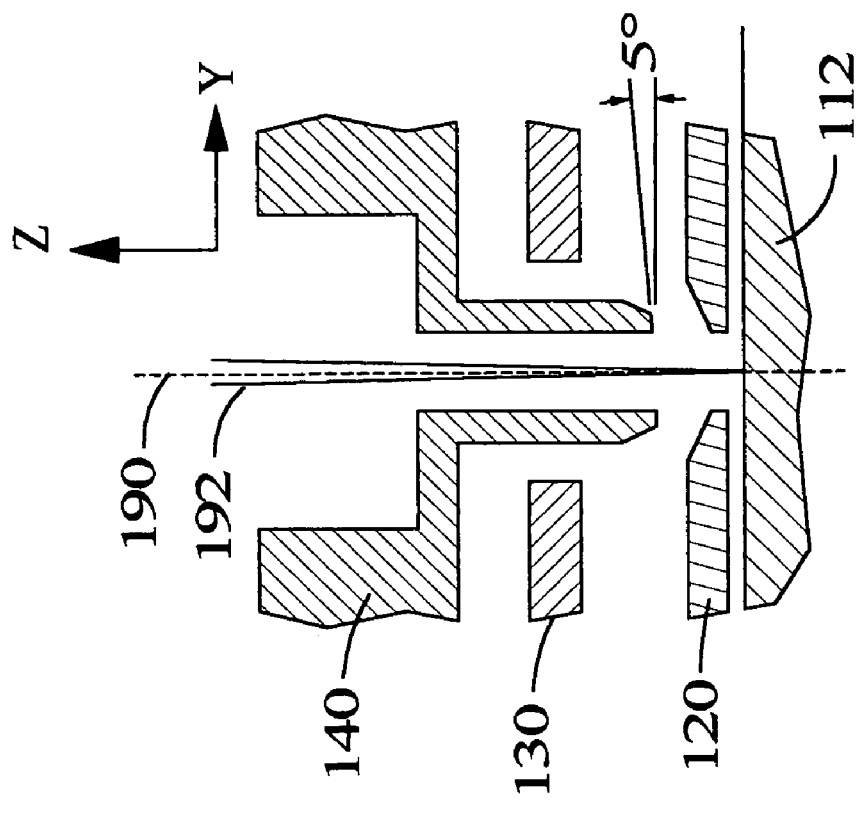
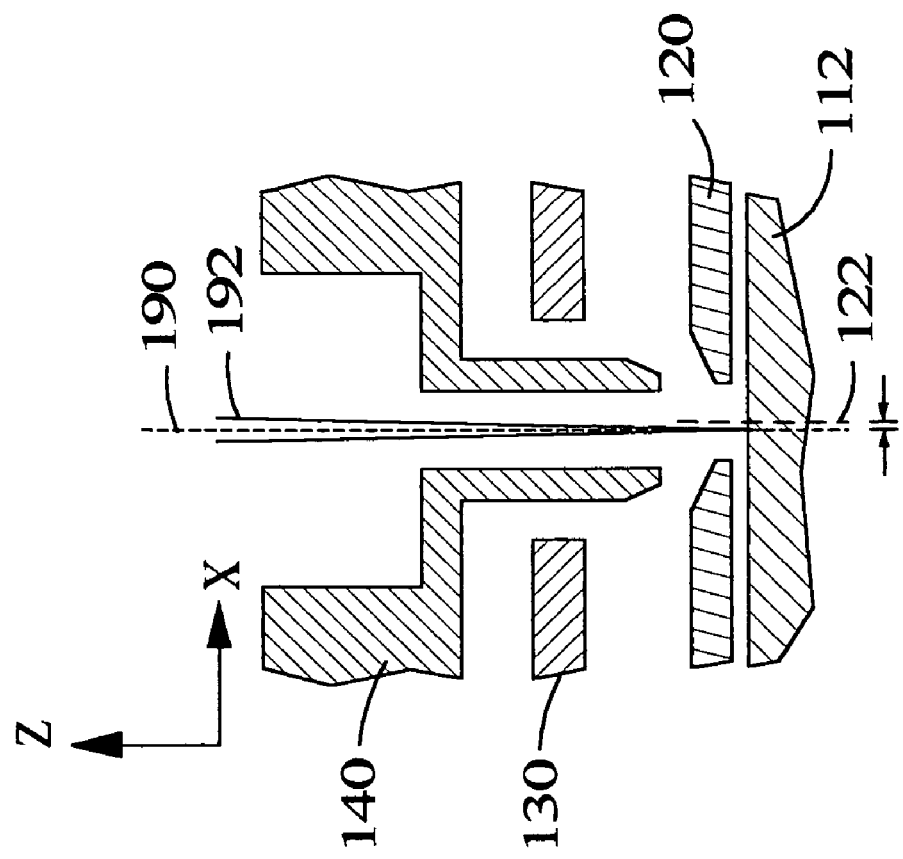
FIG. 9B
FIG. 9A

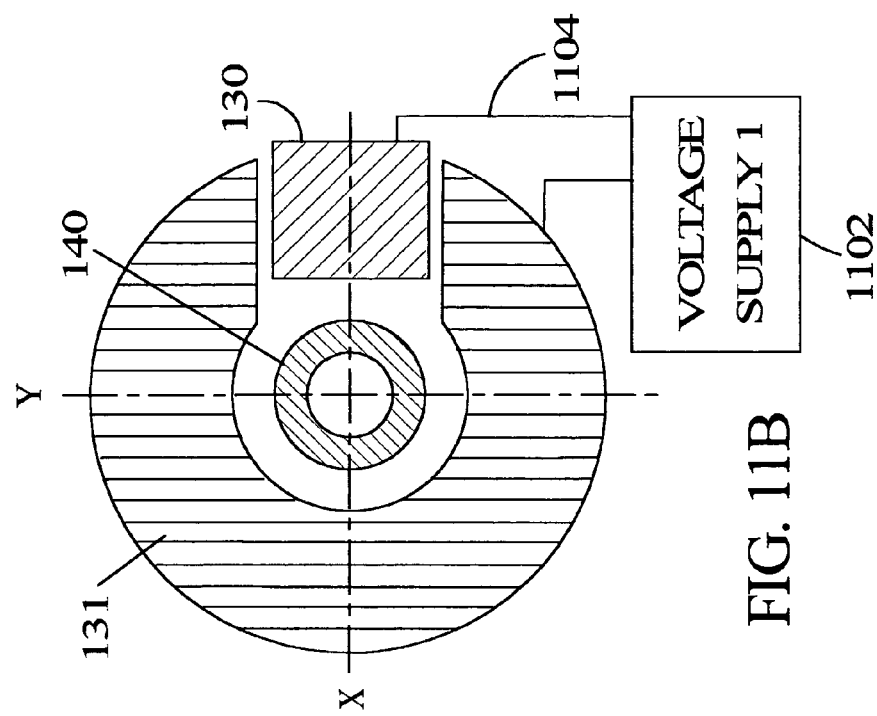
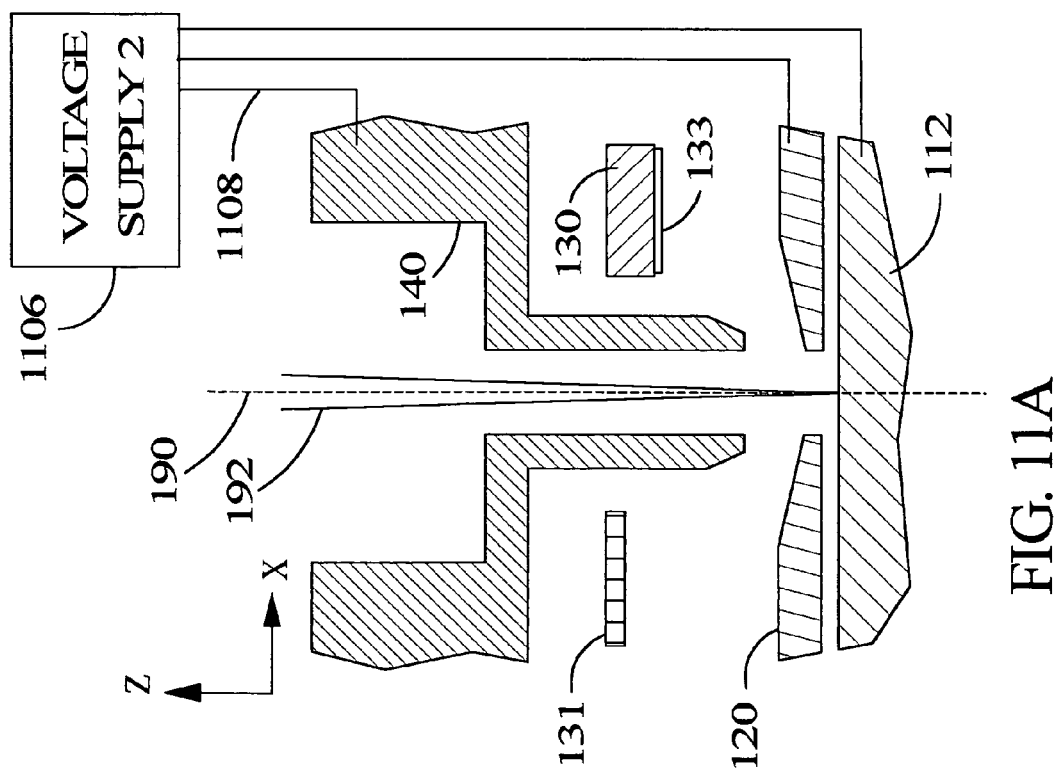
FIG. 11B
FIG. 11A

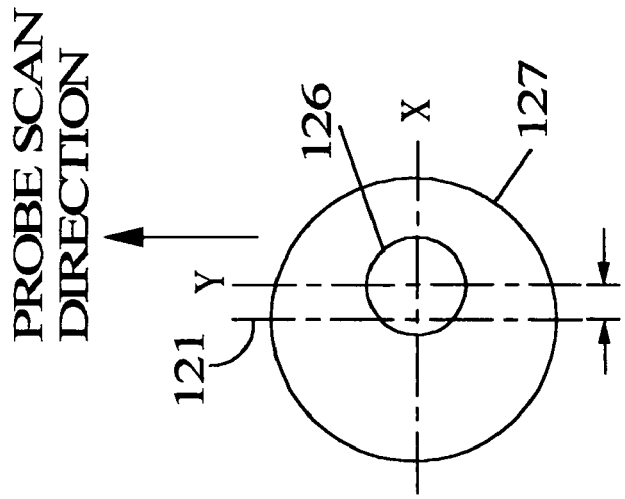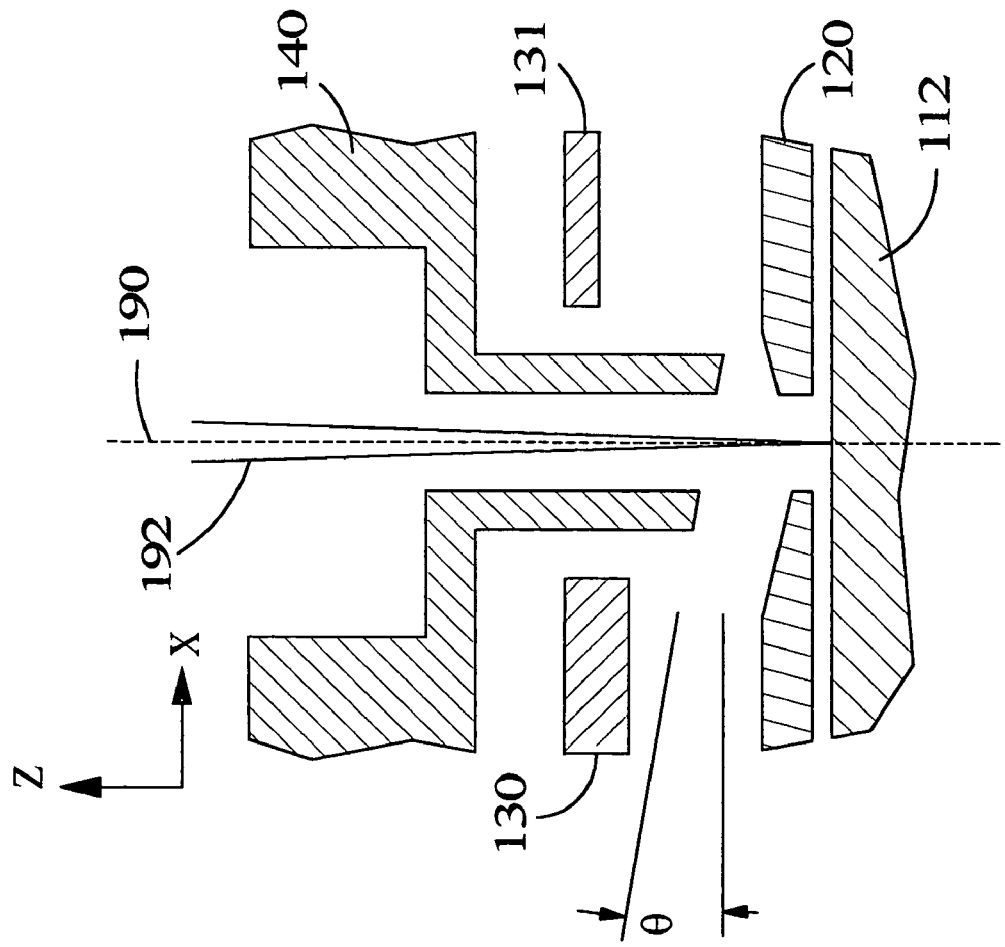

DETECTOR OPTICS FOR CHARGED PARTICLE BEAM INSPECTION SYSTEM

CROSS-REFERENCE TO RELATED APPLICATIONS

This application is a continuation-in-part of U.S. application Ser. No. 10/126,943 filed Apr. 18, 2002 now U.S. Pat. No. 6,777,675, which in turn claims the benefit of U.S. provisional application Ser. No. 60/338,579 filed Apr. 18, 2001.

BACKGROUND OF THE INVENTION

1. Field of the Invention

This invention relates to the field of charged particle optics, and in particular to charged particle optics components for semiconductor wafer and mask defect inspection systems.

2. Description of the Related Art

Charged particle beam systems employed for imaging purposes typically generate a primary beam, of electrons or ions, which is focused onto the surface of a substrate by probe-forming optics. The imaging process generally involves the collection of secondary electrons which are emitted from the substrate surface as a result of the interaction of the primary charged particle beam with the substrate surface. In imaging systems, the energy of the primary charged particle beam striking the substrate surface is generally at least several hundred eV, while the secondary electrons leaving the substrate surface have energies predominantly below 10 eV. In order to form an image of the substrate, it is necessary to separate the secondary electrons from the primary charged particles and collect these secondary electrons with some type of detector.

In many charged particle beam systems, the secondary electron detector is positioned within the probe-forming optics, and a crossed magnetic-electric field filter (commonly called a Wien filter) is used to deflect the secondary electrons off-axis into a detector, while simultaneously allowing the primary beam to pass through the Wien filter undeflected. The main limitation to this approach is that the Wien filter introduces some aberrations into the primary beam, since only one energy in the primary beam is undeflected and the primary beam (with nominal energy $e V_0$) will inherently have a spread in energies ($\pm e \Delta V$) due to the electron source—this is particularly a problem in low voltage columns, where the fractional energy spread ($\Delta V/V_0$) is larger and often unacceptable. Another disadvantage of this approach is cost, since the Wien filter requires both current supplies for the magnetic coils and voltage supplies for the electrostatic electrodes.

In other charged particle beam systems, the secondary electron detector is positioned below the probe-forming optics, and off to one side of the optical axis of the probe-forming optics. In these systems, it is necessary that the electric fields from the secondary electron detector do not substantially affect the primary beam. This requirement typically limits the secondary electron collection efficiency.

In charged particle beam systems where the primary beam energy is low, such as electron beam inspection systems, achieving high secondary electron collection efficiencies is particularly demanding. Clearly, there is a need for improved detector optics which provides high secondary electron collection efficiency combined with minimal distortion of the primary charged particle beam.

SUMMARY OF THE INVENTION

The present invention provides a charged particle beam column for substrate imaging and/or inspection. The column includes detector optics with high secondary electron detection efficiency combined with minimal resultant distortion of the charged particle beam. According to aspects of the invention, the charged particle beam column comprises: a probe optics assembly, for forming a charged particle probe; a secondary electron detector situated below the probe optics assembly; and a symmetrizing electrode situated in close proximity to the secondary electron detector. The symmetrizing electrode and the secondary electron detector are configured to produce a generally cylindrically-symmetric electric field about the optical axis defined by the probe forming optics. In a preferred embodiment the symmetrizing electrode: is generally annular in shape; has inner and outer radii substantially equal to the smallest distance to the secondary electron detector and the smallest distance to the farthest side of the secondary electron detector, respectively, as measured from the optical axis; is centered on the optical axis; and has a gap where the secondary electron detector is situated. A field-free tube may be positioned such that the wall of the field-free tube is located between the optical axis and the combination of the secondary electron detector and the symmetrizing electrode, in order to reduce the exposure of the charged particle beam to the electric fields due to the secondary electron detector and the symmetrizing electrode; the field-free tube is generally cylindrically-symmetric about the optical axis. A substrate electric-field control electrode may be situated between the secondary electron detector and the substrate, in order to control the electric field at the surface of the substrate; the substrate electric-field control electrode is generally cylindrically-symmetric about the optical axis. Voltage supplies are electrically connected to the elements of the detector optics, for keeping the various electrodes at their prescribed set voltages. The probe optics assembly comprises: a charged particle gun; an accelerating region situated below the gun; scanning deflectors situated below the accelerating region; and a focusing electrode and a stigmator situated below the deflectors. The charged particles can be either electrons or ions. A stage is provided below the detector optics for holding the substrate.

According to further aspects of the invention, the detector optics may include a field-free tube and/or a substrate electric-field control electrode which is/are generally cylindrically-symmetric about the optical axis. The strict cylindrical symmetry of the field-free tube and/or substrate electric-field control electrode is broken by a small amount, in order to increase the secondary electron detection efficiency while maintaining acceptable distortion of the charged particle probe. Asymmetry can be introduced in the field-free tube by offsetting the tube from the optical axis or by chamfering the end of the tube; in some embodiments, the field-free tube has a circular bore and a square perimeter. Asymmetry can be introduced in the substrate electric-field control electrode by: offsetting the electrode from the optical axis; introducing notches or bumps onto the aperture in the electrode; and introducing a conical indentation in the top surface of the electrode, where the central axis of the indentation is contained within the aperture in the electrode and offset from the central axis of the aperture.

BRIEF DESCRIPTION OF THE FIGURES

FIG. 9A shows a first cross-sectional representation of detector optics including an offset substrate electric-field control electrode, in combination with a chamfered field-free tube.

FIG. 9B shows a second cross-sectional representation of the detector optics of FIG. 9A.

FIG. 11A shows a first cross-sectional representation of detector optics including a symmetrizing electrode.

FIG. 11B shows a second cross-sectional representation of the detector optics of FIG. 11A, the cross-section being in the plane of the symmetrizing electrode.

FIG. 12A shows a cross-sectional representation of a preferred embodiment of the detector optics of the invention.

FIG. 12B shows a top view of the surface of the conical indentation in the substrate electric-field control electrode of FIG. 12A.

DETAILED DESCRIPTION

The invention disclosed herein is a charged particle beam column including detector optics with high secondary electron detection efficiency combined with minimal resultant distortion of the charged particle beam. The columns can be optimized for use with either ion or electron beams. The column optical components can be fabricated on a millimeter scale, and are consequently well suited for millimeter scale charged particle beam columns (typically comprised of electrostatic lenses, stigmators, deflectors, etc.). Such millimeter scale columns can be combined to comprise the imaging part of a multi-beam multi-column electron beam inspection system for the semiconductor industry (where multiple columns must fit over a semiconductor wafer or mask). The details of such a multi-beam multi-column electron beam inspection system are found in US Patent Application Publication Nos. US 2002/0015143A1 and US 2003/0066963A1, incorporated by reference herein.

Figure 1:
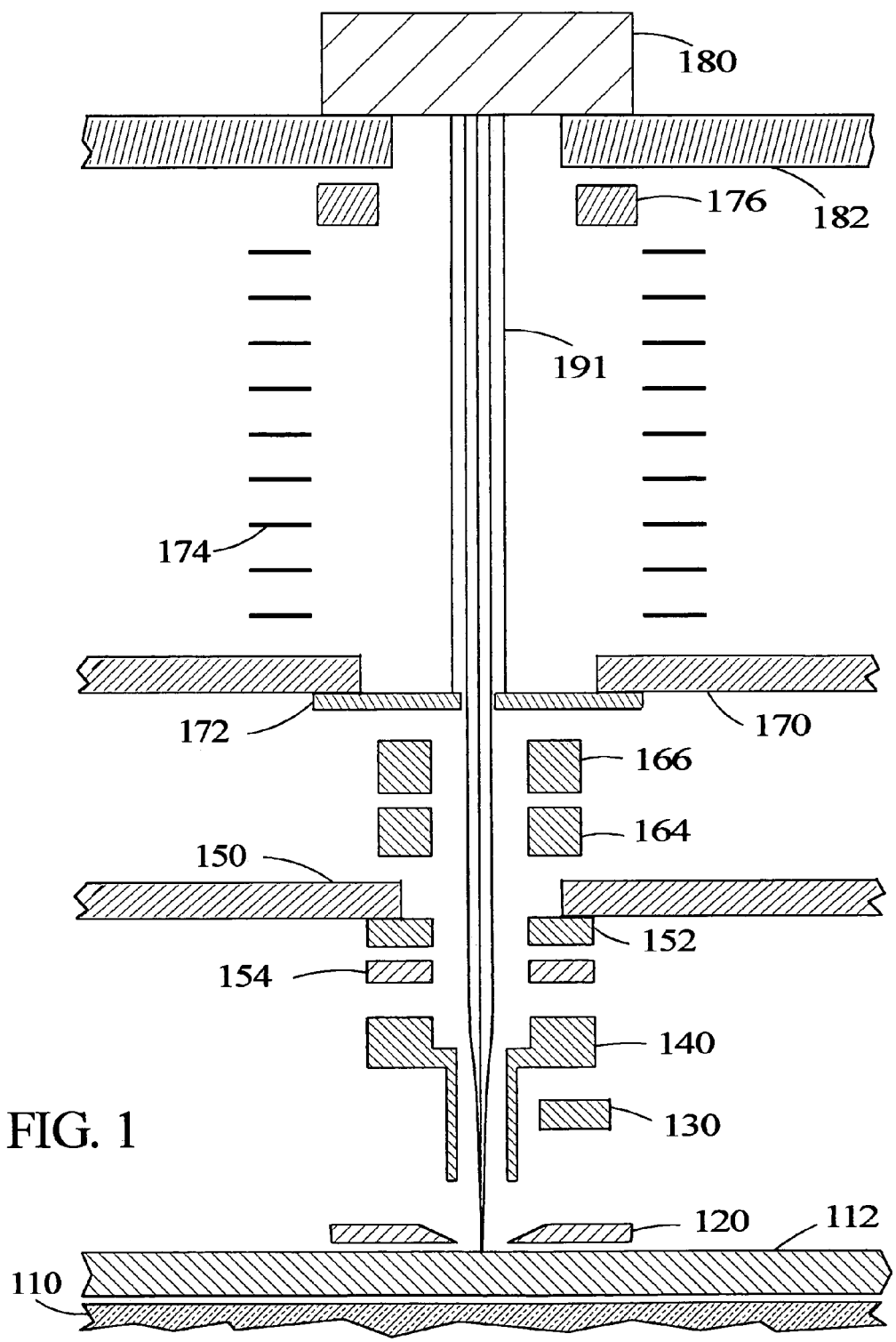
FIG. 1 shows a schematic cross-sectional representation of an electron optical column.

A schematic cross-sectional representation of a single electron beam column, suitable for use in a multi-column electron beam inspection system, is shown in FIG. 1; a detailed description of this electron beam column can be found in US Patent Application Publication Nos. US 2002/0015143A1 and 2003/0066963A1, incorporated by reference herein. In FIG. 1, stage 110, substrate 112, substrate electric-field control electrode 120, secondary electron (SE) detector 130, field-free tube 140, focus electrode mounting plate 150, stigmator 152, focus electrode 154, subfield deflector 164, main-field deflector 166, final accelerator electrode 170, beam defining disc 172, accelerating plates 174, alignment deflector 176, electron gun 180, first accelerator electrode 182 and electron beam 191 are shown. The position of the electron gun 180 within the electron optical column is considered to be the "top" of the column, and the stage 110 is considered to be at the "bottom" of the column. The combination of the focus lens, the stigmator, the scanning deflectors, the accelerating region, the electron gun and the related components is referred to as the probe optics assembly and the combination of the substrate electric-field control electrode, the SE detector, the field-free tube and related components is referred to as the detector optics. Furthermore, the combination of the substrate electric-field control electrode and the field-free tube is referred to as the control electrode assembly.

A simplified explanation of the electron optical column operation is as follows: the electron gun 180 creates a narrow, focused electron beam; the alignment deflector 176 precisely steers the beam down the center of the column; the electron beam is accelerated to high energy through the accelerating region, which is the region between first accelerator electrode 182 and final accelerator electrode 170; the diameter of the beam 191 is reduced by the beam defining disc 172—this disc controls the half-angle of the beam at the substrate 112 and the half-angle determines the magnitude of the geometric and chromatic aberrations in the beam, and thus the final beam size at the substrate; the focus lens 154 and stigmator 152 focus the beam to a small spot on the substrate 112; the scanning deflectors 164 and 166 scan the beam over the substrate 112; and the secondary electrons created by the primary beam are captured by the SE detector 130.

As shown in FIG. 1, the first accelerator electrode 182, the final accelerator electrode 170 and the focus electrode mounting plate 150 extend beyond the other electrodes and are used to provide mechanical integrity and to simplify electrical connections. When such columns are combined to make a multi-column system, the first accelerator electrode, the final accelerator electrode and the focus electrode mounting plate are continuous through the entire multi-column electron optics assembly. More detail is provided in US Patent Application Publication Nos. US 2002/0015143A1 and US 2003/0066963A1, incorporated by reference herein.

Note that the components in FIG. 1 are not drawn to scale; for example, in a preferred embodiment, each column is roughly 160 mm in length, with the majority of the length represented by the accelerating region. The electron gun 180 shown in FIG. 1 can comprise a Schottky emitter, a single crystal thermal emitter, a cold field emitter or a plurality of cold field emission electron sources, for example. A single (non-annular) SE detector 130, as shown in FIG. 1 may be used; alternative embodiments include an annular detector and a multi-sectored detector. A multi-sectored detector can detect topographical information by adding angular information to the detected signal. In one embodiment of the present invention, the SE detector is a four-quadrant detector and is held at a potential of roughly 5 kV.

Figure 2:
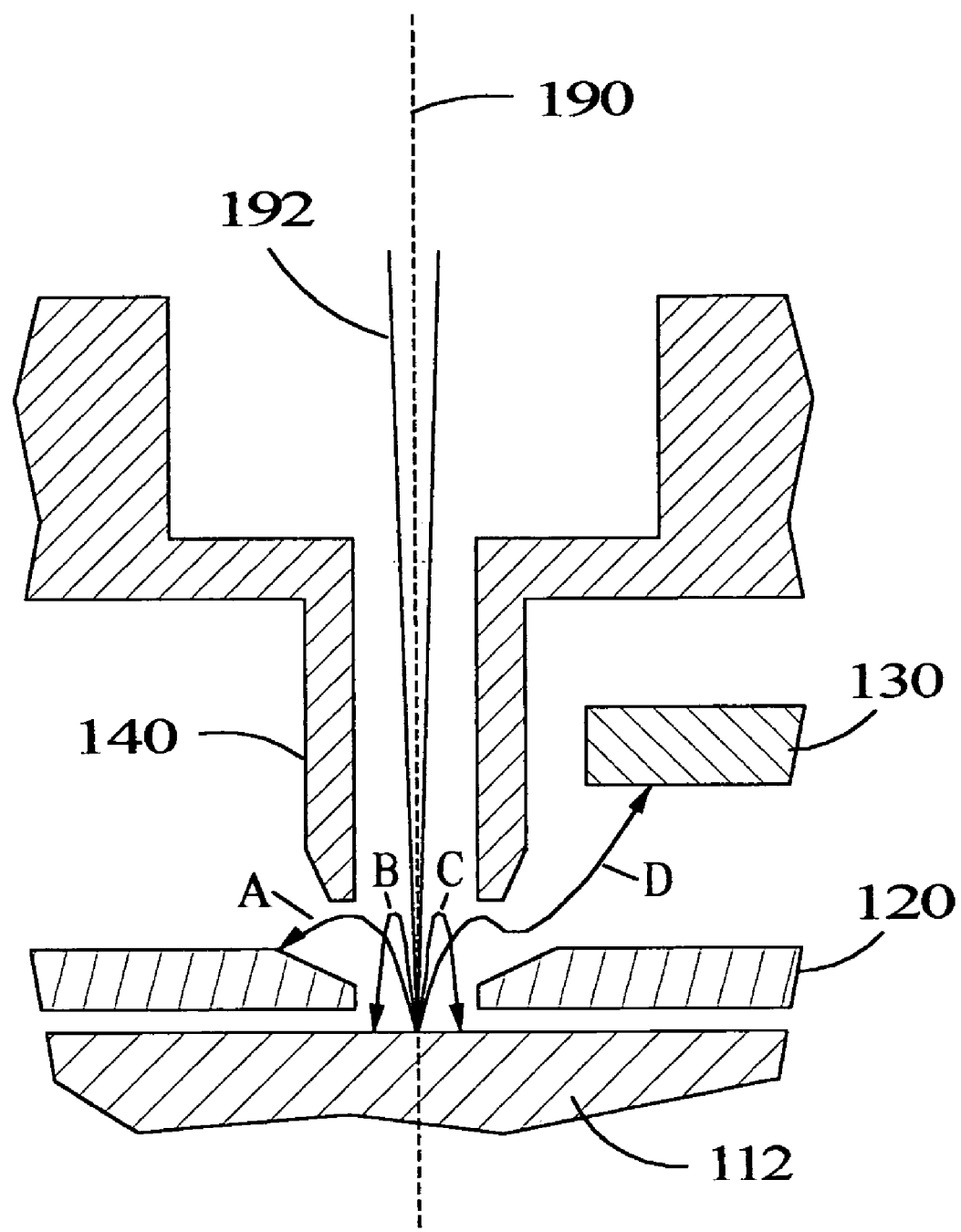
FIG. 2 shows a cross-sectional representation of detector optics, including simulated secondary electron trajectories.

The lower end of the electron beam column of FIG. 1 is shown in FIG. 2; further details of the detector optics shown in FIG. 2 can be found in US Patent Application Publication Nos. US 2002/0015143A1 and US 2003/0066963A1, incorporated by reference herein. In FIG. 2, substrate 112, substrate electric-field control electrode 120, SE detector 130, field-free tube 140, optical axis 190, electron probe 192, and secondary electron trajectories A, B, C & D are shown. In brief, the detector optics design and configuration are optimized to give good secondary electron collection efficiency, while minimizing perturbation of the electron probe 192 by the secondary electron detector 130. A more detailed discussion of the detector optics components follows.

The field-free tube 140 is cylindrically symmetric about the optical axis 190. The main function of the field-free tube is to reduce the exposure of the electron probe 192 to the electric field due to the SE detector 130—the wall of the field-free tube is positioned between the SE detector and the optical axis and screens the electron probe from the electric field due to the SE detector along most of the length of the optical axis. In order for the field-free tube to separate the secondary electrons (emitted from the substrate surface) from the primary electrons (in the electron probe), the field-free tube is held at a potential that is slightly lower than that of the substrate 112. Typically, secondary electrons have an energy range that is less than 10 eV and primary electrons have an energy of 1 keV (typical for wafer or mask inspection), both relative to the substrate. As the secondary electrons are emitted from the surface, they travel towards the field-free tube; however, the secondary electrons have insufficient energy to enter the field-free tube because of a negative, typically 15–20 V, potential difference between the field-free tube and the substrate. Thus, the secondary electrons will be pushed away from the field-free tube and attracted to the SE detector.

The substrate electric-field control electrode 120 is cylindrically symmetric about the optical axis 190. The substrate electric-field control electrode has two functions: (1) to enhance secondary electron collection efficiency and (2) to allow for voltage contrast imaging of the substrate surface. The substrate electric-field control electrode is held a very short distance above the substrate 112 (100–500 μm in a preferred embodiment). The substrate electric-field control electrode has a small (typically 1 mm) aperture through which the primary and secondary electrons travel. The sides of the aperture may be beveled at a typical angle of arctan $(1/\sqrt{2})$ with respect to the substrate surface, so as to assist in creating a field-free region on the substrate surface when the substrate electric-field control electrode is held at a potential very close to that of the substrate. This field-free region near the substrate is necessary to prevent the extraction of excessive numbers of secondary electrons from the substrate, which would tend to cause positive charging of the substrate surface. Alternatively, the substrate electric-field control electrode can be operated as an electron energy high pass filter—blocking lower energy secondary electrons and allowing higher energy secondary electrons to reach the SE detectors 130, thus providing voltage contrast.

Consider the secondary electron trajectories shown in FIG. 2: some secondary electrons, following trajectories such as A, strike a surface and are lost to the SE detector 130; other secondary electrons, which leave nearly perpendicular to the substrate surface, are reflected back to the substrate 112 by the field-free tube 140, as illustrated by trajectories B & C; a fraction of the secondary electrons follow trajectories such as D which reach the SE detector. Despite the careful design of the control electrode assembly, as described above, the collection efficiency of secondary electrons is lower than may be desired.

Figure 3B:
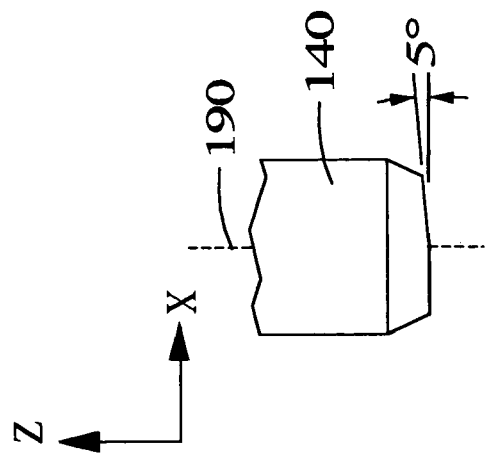
FIG. 3B shows a side view of part of the chamfered field-free tube of FIG. 3A.
Figure 3A:
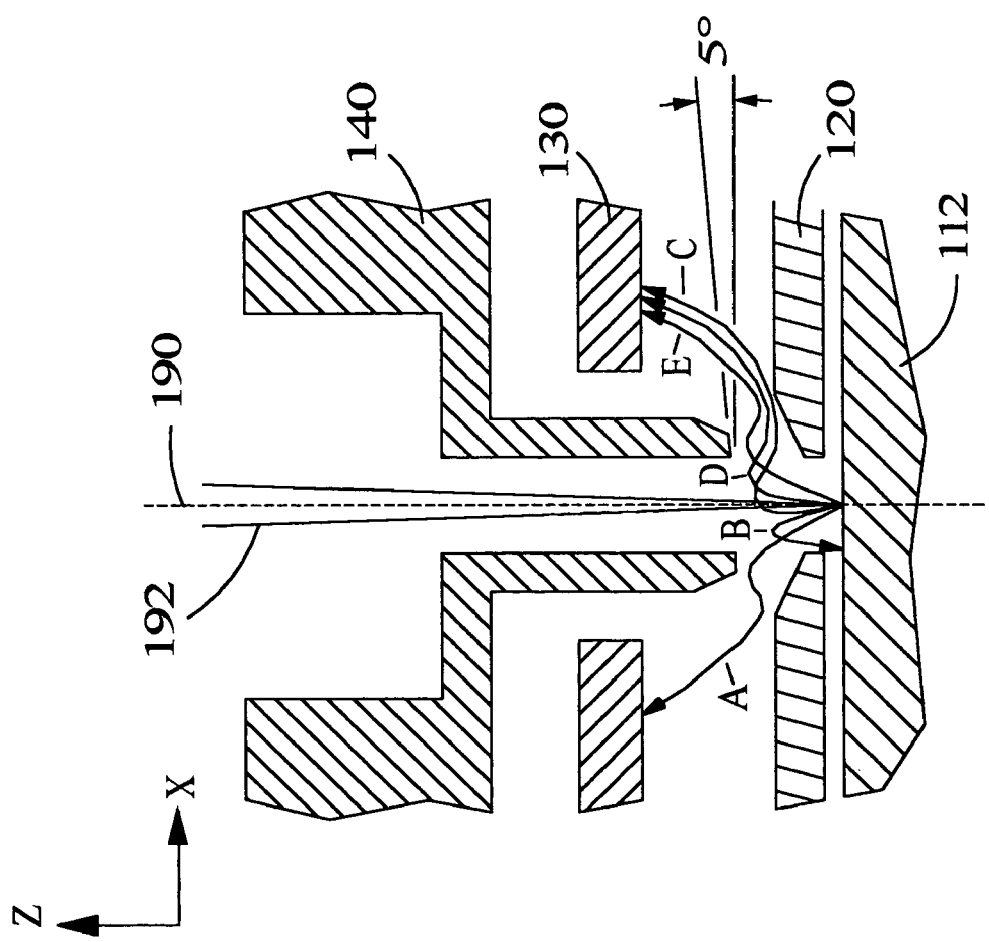
FIG. 3A shows a cross-sectional representation of detector optics including a chamfered field-free tube and simulated secondary electron trajectories.

FIGS. 3A & 3B show detector optics with a control electrode assembly which is generally cylindrically-symmetric about the optical axis—the strict cylindrical symmetry of the control electrode assembly is broken by a small adjustment to the field free tube 140. In FIG. 3A, substrate 112, substrate electric-field control electrode 120, SE detector 130, field-free tube 140, optical axis 190, electron probe 192, and secondary electron trajectories A, B, C, D & E are shown. In FIG. 3B, field-free tube 140 and optical axis 190 are shown. A chamfer is shown on the lower end of the field-free tube 140; in the example shown in FIGS. 3A & 3B the chamfer is a planar surface perpendicular to the X-Z plane and at approximately 5 degrees to the X-Y plane, extending from a diameter of the field-free tube parallel to the Y direction over half of the lower end of the tube. The exact angle and extent of the chamfer will depend on the desired performance of the detector optics; however, any such modification of the field-free tube serves to break the cylindrical symmetry. This chamfer allows the SE detectors electric field to have a greater effect on the region surrounding the optical axis and just above the substrate. Now, secondary electrons which leave nearly perpendicular to the substrate surface follow trajectories such as C & D and reach the SE detector; however, there are still a small fraction of secondary electrons which do not reach the SE detector, as shown by trajectory B. Modeling of the secondary electron collection efficiency shows that there is a significant improvement for the detector optics with the chamfered field-free tube over the detector optics with strictly cylindrically-symmetric control electrodes. Note that the electric field on the optical axis 190, between the lower end of field-free tube 140 and the substrate 112, should be strong enough to improve the secondary electron detection efficiency, and yet not too strong to produce unacceptable distortion of the primary electron beam (electron probe 192).

Figure 4:
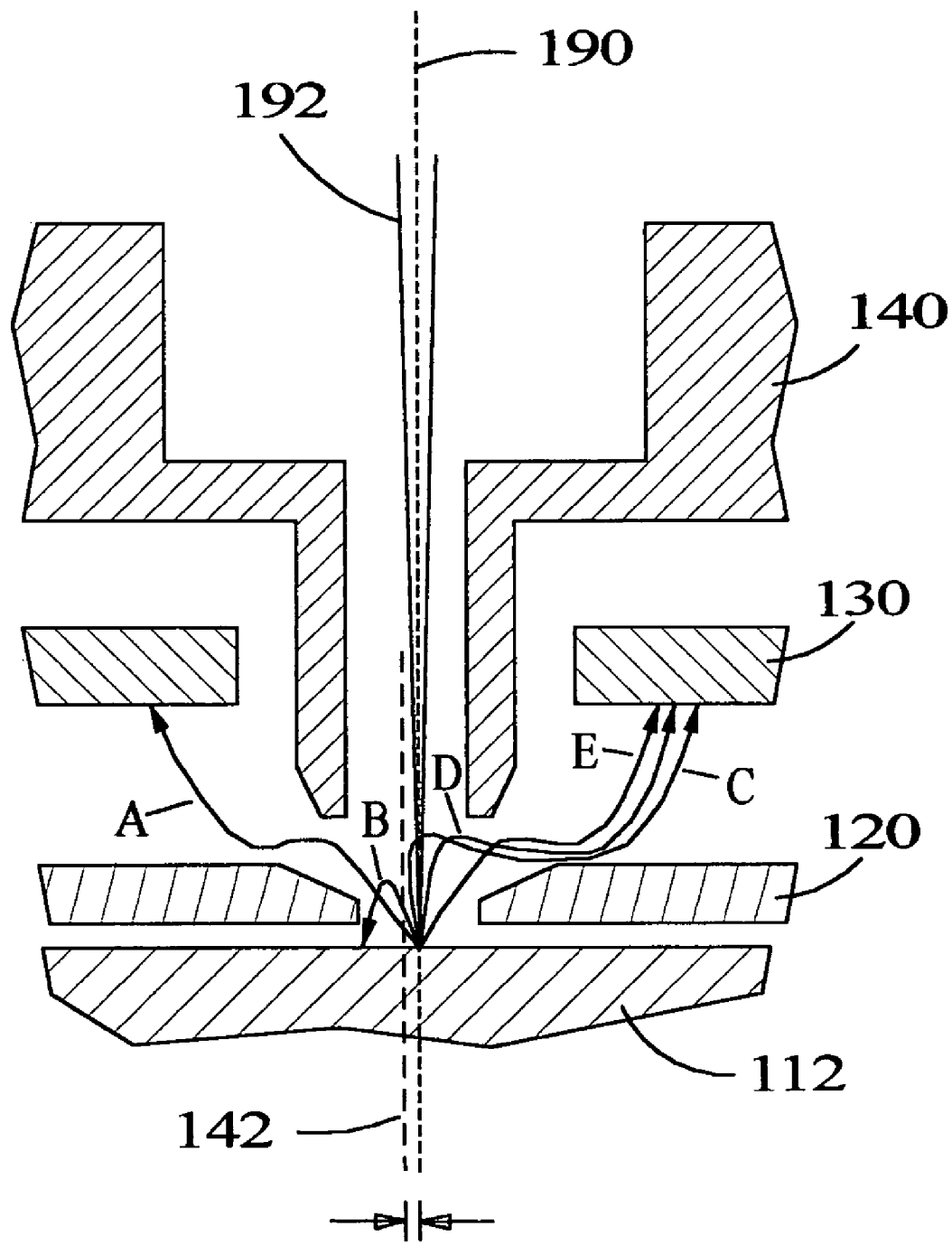
FIG. 4 shows a cross-sectional representation of detector optics including an offset field-free tube and simulated secondary electron trajectories.

FIG. 4 shows another embodiment of the detector optics with a control electrode assembly which is generally cylindrically-symmetric about the optical axis—the strict cylindrical symmetry of the control electrode assembly is broken by another small adjustment to the field free tube 140. In FIG. 4, substrate 112, substrate electric-field control electrode 120, SE detector 130, field-free tube 140, field-free tube axis 142, optical axis 190, electron probe 192, and secondary electron trajectories A, B, C, D & E are shown. The field-free tube 140 is shown offset from the optical axis 190, such that the field-free tube axis 142 is offset from, but parallel to, the optical axis. As illustrated by the secondary electron trajectories A, B, C, D and E, the effect of moving the field-free tube 140 slightly off the electron optical axis 190 gives a similar result to that of chamfering the field-free tube, as shown in FIGS. 3A & 3B.

Figure 5:
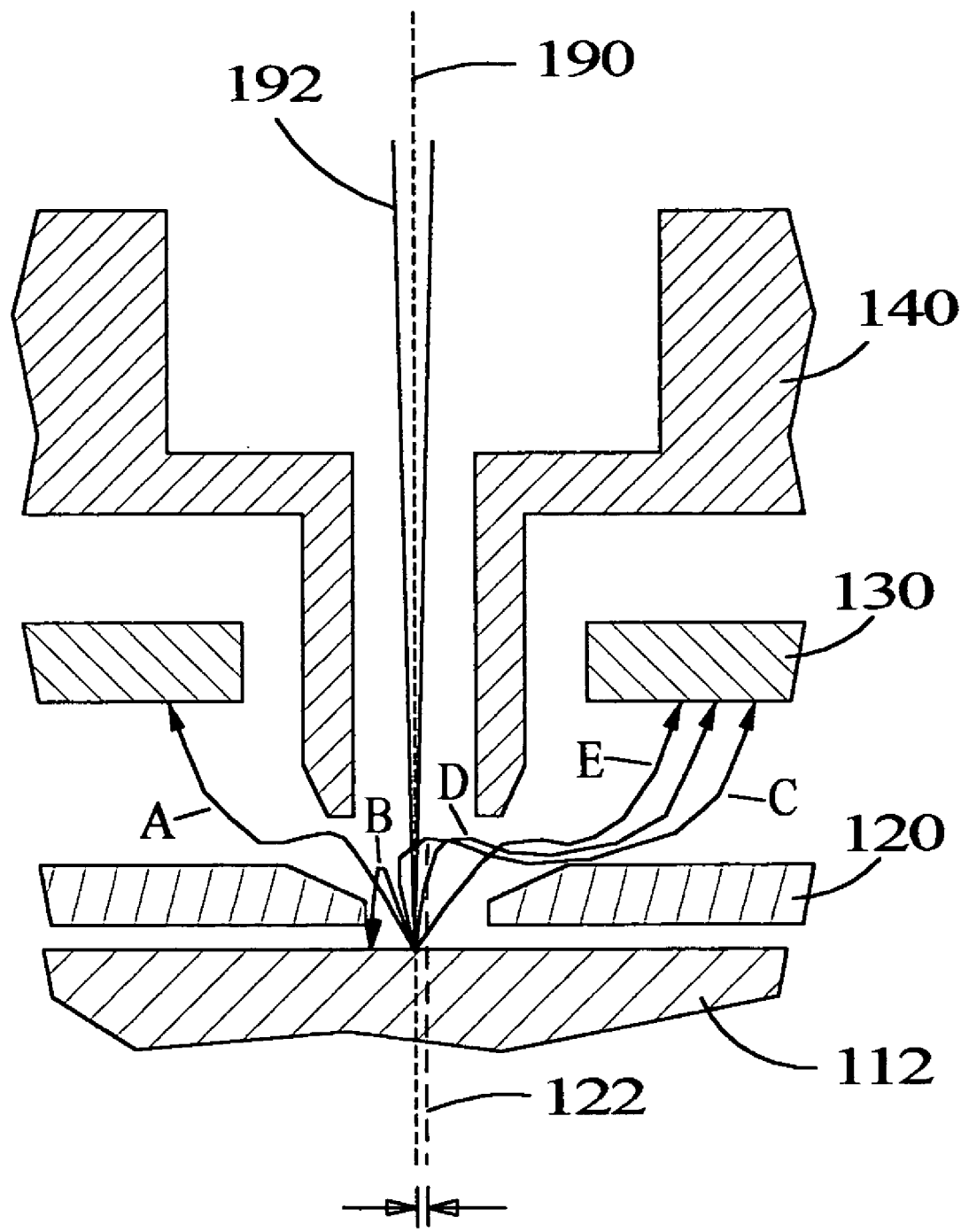
FIG. 5 shows a cross-sectional representation of detector optics including an offset substrate electric-field control electrode and simulated secondary electron trajectories.

FIG. 5 shows a further embodiment of the detector optics with a control electrode assembly which is generally cylindrically-symmetric about the optical axis—the strict cylindrical symmetry of the control electrode assembly is broken by a small adjustment to the substrate electric-field control electrode 120. In FIG. 5, substrate 112, substrate electric-field control electrode 120, substrate electric-field control electrode axis 122, SE detector 130, field-free tube 140, optical axis 190, electron probe 192, and secondary electron trajectories A, B, C, D & E are shown. The substrate electric-field control electrode 120 is shown offset from the optical axis 190, such that the substrate electric-field control electrode axis 122 is offset from, but parallel to, the optical axis. The effect of offsetting the substrate electric-field control electrode on secondary electron trajectories A, B, C, D & E is very similar to that of offsetting the field-free tube 140, as shown in FIG. 4.

Figure 6B:
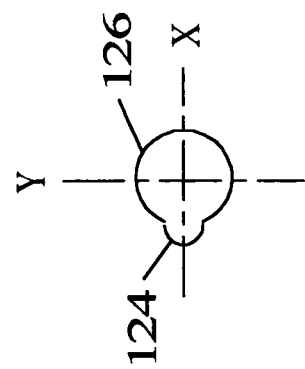
FIG. 6B shows a plan view of the inner aperture of the substrate electric-field control electrode of FIG. 6A.
Figure 6A:
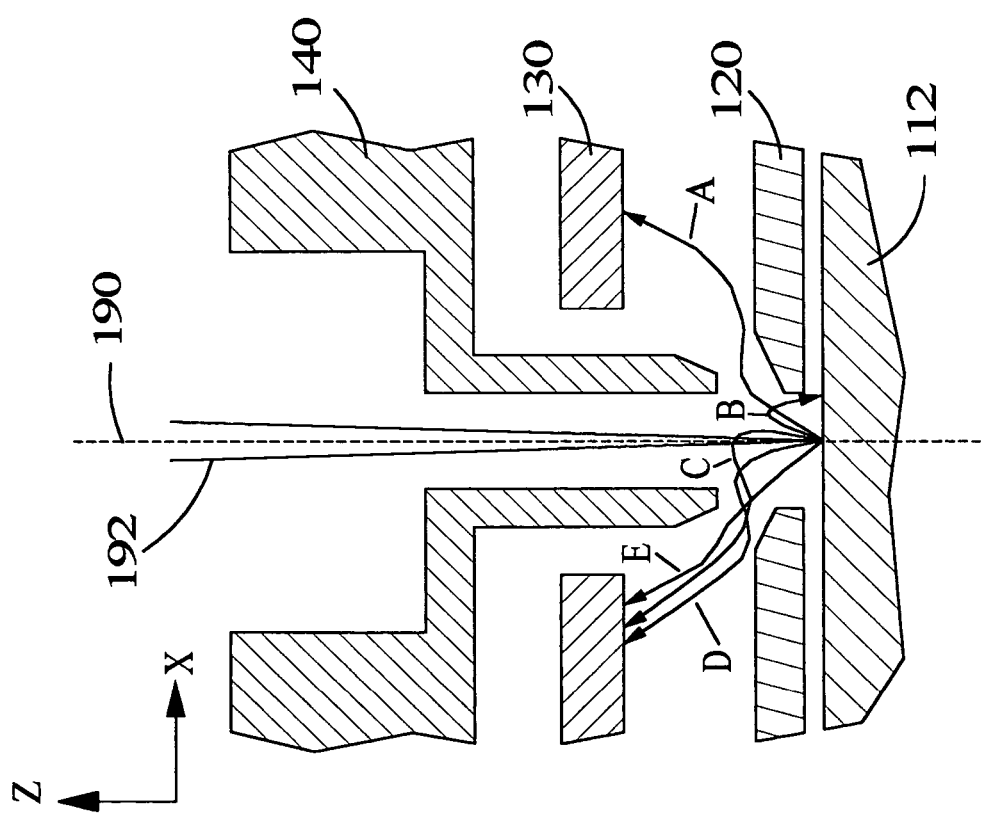
FIG. 6A shows a cross-sectional representation of detector optics including a substrate electric-field control electrode having a notch on the inner aperture circumference and simulated secondary electron trajectories.

FIGS. 6A & 6B show another embodiment of the detector optics with a control electrode assembly which is generally cylindrically-symmetric about the optical axis—the strict cylindrical symmetry of the control electrode assembly is broken by the introduction of a notch 124 to the substrate electric-field control electrode 120. In FIG. 6A, substrate 112, substrate electric-field control electrode 120, SE detector 130, field-free tube 140, optical axis 190, electron probe 192, and secondary electron trajectories A, B, C, D & E are shown. In FIG. 6B, substrate electric-field control electrode notch 124 and substrate electric-field control electrode inner aperture 126 are shown in a top view. Note that secondary electron trajectories are deflected toward the notch 124 in substrate electric-field control electrode 120.

Figure 7B:
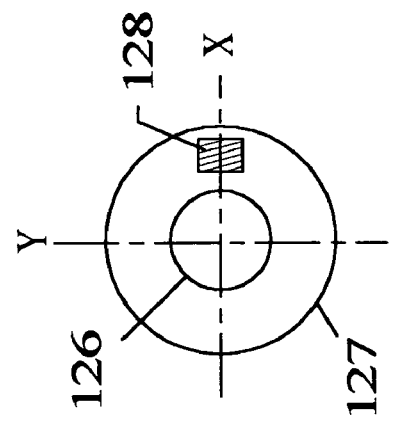
FIG. 7B shows a plan view of the beveled inner surface of the substrate electric-field control electrode of FIG. 7A.
Figure 7A:
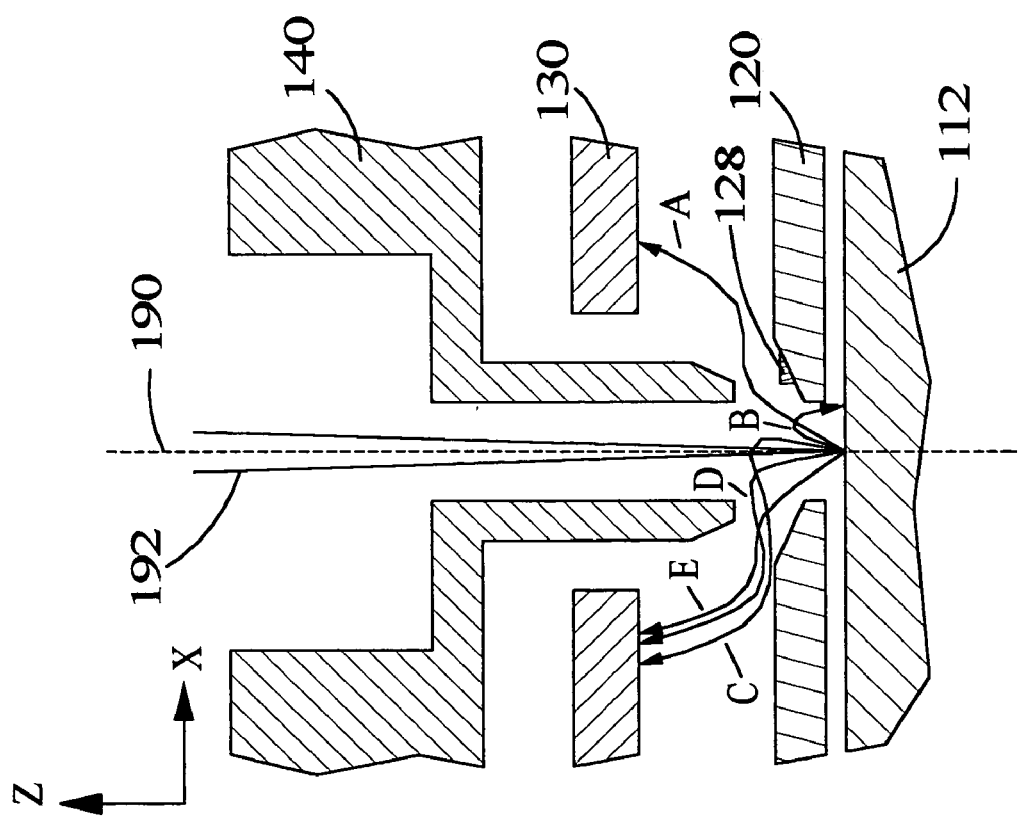
FIG. 7A shows a cross-sectional representation of detector optics including a substrate electric-field control electrode having a bump on the beveled inner surface and simulated secondary electron trajectories.

FIG. 7 shows a further embodiment of the detector optics with a control electrode assembly which is generally cylindrically-symmetric about the optical axis—the strict cylindrical symmetry of the control electrode assembly is broken by the addition of a bump 128 to the substrate electric-field control electrode 120. In FIG. 7A, substrate 112, substrate electric-field control electrode 120, substrate electric-field control electrode bump 128, SE detector 130, field-free tube 140, optical axis 190, electron probe 192, and secondary electron trajectories A, B, C, D & E are shown. In FIG. 7B, substrate electric-field control electrode inner aperture 126, substrate electric-field control electrode beveled inner surface circumference 127, and substrate electric-field control electrode bump 128 are shown in a top view. Note that secondary electron trajectories are deflected away from the bump 128 on substrate electric-field control electrode 120.

Figure 8B:
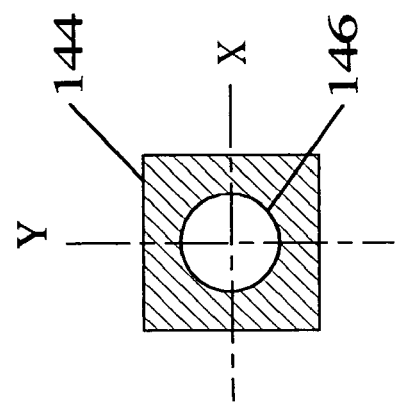
FIG. 8B shows a cross-sectional representation of the lower end of the field-free tube of FIG. 8A, the cross-section being in the X-Y plane in proximity to the secondary electron detector.
Figure 8A:
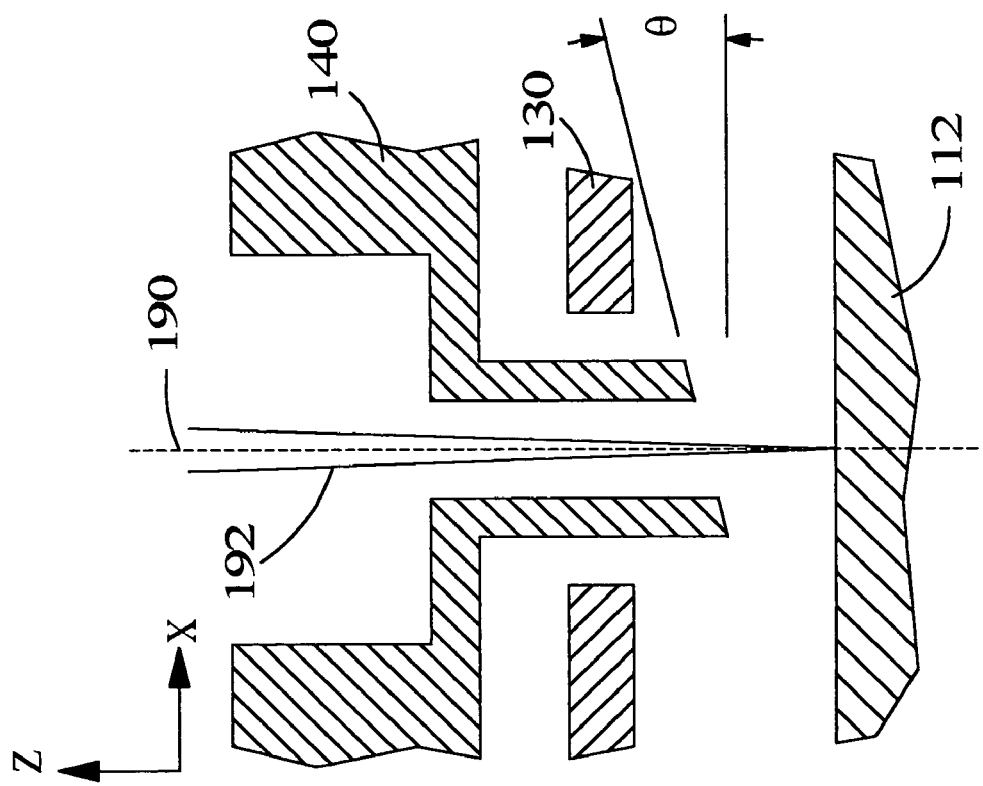
FIG. 8A shows a cross-sectional representation of detector optics with a chamfered field-free tube and without a substrate electric-field control electrode.

FIG. 8 shows an embodiment of the invention where the detector optics has no substrate electric-field control electrode. In FIG. 8A, substrate 112, SE detector 130, field-free tube 140, optical axis 190, and electron probe 192 are shown. In FIG. 8B, field-free tube square perimeter 144 and field-free tube bore circumference 146 are shown in cross-section. A chamfer is shown on the lower end of the field free tube 140; in the example shown in FIGS. 8A & 8B the chamfer is a surface plane perpendicular to the X-Z plane and at approximately 30 degrees to the X-Y plane, extending across the entire lower end of the tube. Further, as shown in the cross-section parallel to the X-Y plane (FIG. 8B), this particular embodiment has a field free tube 140 with a square perimeter 144. Having no substrate electric-field control electrode results in a larger vertical component (parallel to the optical axis 190) of the electric field at the surface of the substrate 112; this increases the collection efficiency for secondary electrons emitted at angles very close to the plane of the substrate surface. The effect of the square perimeter 144 is to shepherd the secondary electrons away from the corners of the square; this may be of use in directing the secondary electrons to different sectors in a multi-sectored SE detector (a four-quadrant detector may be most efficient for the square-perimeter field free tube). The orientation of the square perimeter 144 in the X-Y plane is shown in FIG. 8B; this orientation can be changed to optimize secondary electron collection, depending on the position of the sectors of the SE detector. The combined effect of the chamfered field-free tube 140 and the square perimeter 144 can be optimized for certain applications by aligning the chamfer along the diagonal of the square (this would be the case if the square in FIG. 8B were rotated through 45 degrees from what is shown). Note that the field-free tube with square perimeter, as shown in FIGS. 8A & 8B, may be quite effective for use with a four-quadrant secondary electron detector without needing a chamfer on the lower end of the tube. Furthermore, the field-free tube with a chamfer extending across the entire lower end of the tube may be quite effective for use with certain SE detectors (such as an annular detector) without needing a square perimeter.

As discussed above, there are many different ways to break the strict cylindrical symmetry of the control electrodes and thus provide improved detector optics performance. In summary: various chamfers, cuts or bevels can be introduced into the end of the field-free tube; notches can be cut in the substrate electric-field control electrode; bumps can be added to the substrate electric-field control electrode; and the control electrodes can be offset from the electron optical axis. Basically, any modification of the control electrodes that introduces enough asymmetry to the electric field to improve the collection efficiency of secondary electrons, without introducing unacceptable probe distortions, is desirable. More than one modification can be combined to effect; an example of a combination of modified components is shown in FIGS. 9A & 9B.

FIGS. 9A & 9B show schematic cross sections in the X-Z and Y-Z planes, respectively. The offset of the substrate electric-field control electrode 120 is evident in FIG. 9A and the chamfer on the end of the field-free tube 140 is evident in FIG. 9B. In FIGS. 9A and 9B, substrate 112, substrate electric-field control electrode 120, SE detector 130, field-free tube 140, optical axis 190, and electron probe 192 are shown. In FIG. 9A, substrate electric-field control electrode axis 122 is also shown. The relative orientation of the chamfer and the offset can be varied in order to optimize secondary electron collection for different secondary electron detector configurations.

Figure 10B:
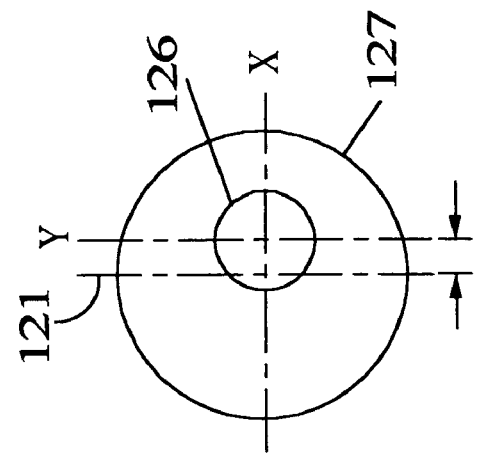
FIG. 10B shows a top view of the surface of the conical indentation in the substrate electric-field control electrode of FIG. 10A.
Figure 10A:
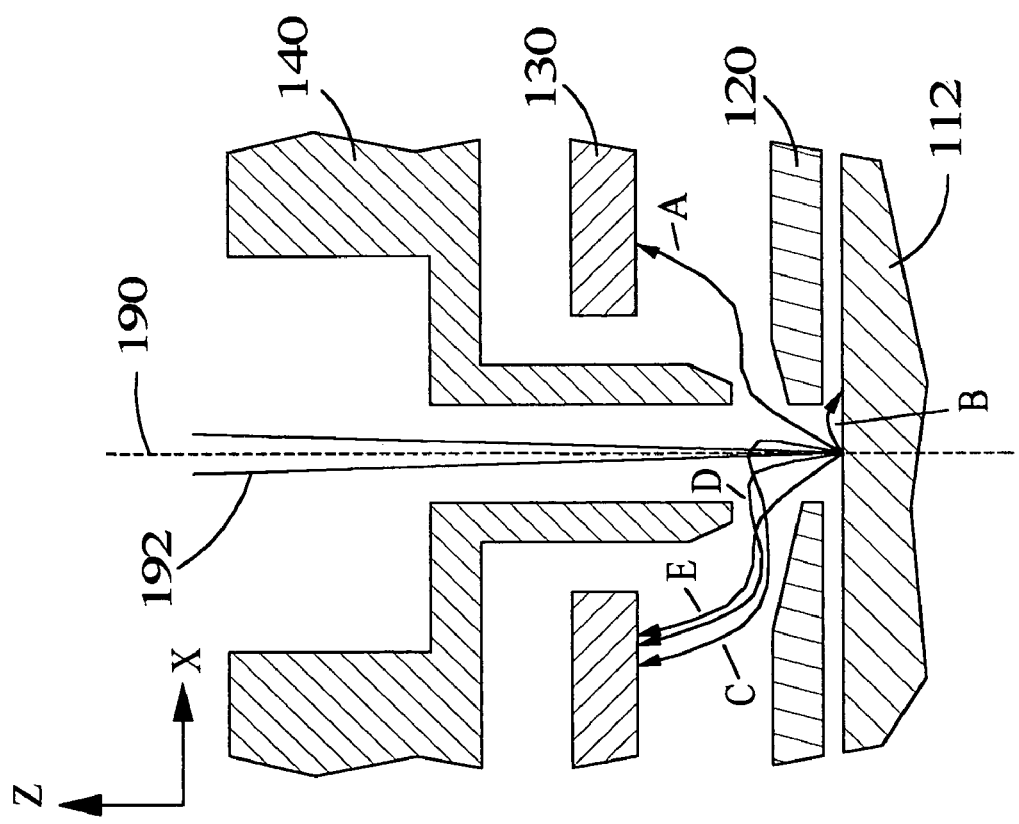
FIG. 10A shows a cross-sectional representation of detector optics including a substrate electric-field control electrode having an offset conical indentation in its top surface and an on-axis circular aperture therethrough.

In FIGS. 10A & 10B, a further embodiment of the detector optics of this invention, including a preferred embodiment of the substrate electric-field control electrode, is shown. FIG. 10A is a cross-sectional view of the detector optics in the X-Z plane showing substrate 112, substrate electric-field control electrode 120, SE detector 130, field-free tube 140, optical axis 190, electron probe 192, and secondary electron trajectories A, B, C, D & E. FIG. 10B shows a top view of the surface of a conical indentation in the substrate electric-field control electrode 120 showing a circular aperture 126 therethrough. The aperture 126 is concentric with the inner diameter of the field-free tube 140 and is centered on the optical axis 190. The circle 127 represents the intersection of the conical indentation with the top surface of the substrate electric-field control electrode. The axis of the conical indentation is parallel to the optical axis 190 and is offset from the optical axis by the distance between the Y-axis and the axis 121. The axis of the conical indentation passes through the aperture 126; furthermore, it is preferred that the axis of the conical indentation be positioned away from the edge of the aperture and/or the depth of the conical indentation is less than the thickness of the substrate electric-field control electrode, so as to avoid having very thin, and mechanically weak, edges to the aperture.

Consider the secondary electron trajectories shown in FIG. 10A: most secondary electrons follow trajectories such as A, C, D & E reach the SE detector; however, there is still a small fraction of secondary electrons—those which leave the substrate at a small angle to the surface—which do not reach the SE detector 130, as shown by trajectory B. Modeling of the secondary electron collection efficiency shows that there is a significant improvement for the detector optics with the substrate electric-field control electrode with an offset conical indentation over the detector optics with strictly cylindrically-symmetric control electrodes.

The various control electrode configurations shown in FIG. 3 through 10 typically direct a larger portion of the secondary electrons towards one side of the SE detector 130. In general, it is desirable to minimize the collection area of the SE detector to improve the signal-to-noise ratio, increase the bandwidth and lower costs. In order to preserve the generally cylindrical symmetry of the detector optics, while substantially reducing the size of the SE detector, a symmetrizing electrode 131 is added to the detector optics as shown in FIG. 11A. The electrostatic field due to the combination of SE detector 130 and symmetrizing electrode 131 in FIG. 11A is similar to the electrostatic field due solely to the annular detector 130 in FIGS. 3 through 10. FIG. 11A shows a cross-sectional view in the X-Z plane and FIG. 11B shows a cross-sectional view in the X-Y plane through the symmetrizing electrode 131. In FIGS. 11A & 11B, substrate 112, substrate electric-field control electrode 120, SE detector 130, symmetrizing electrode 131, detector chip 133 (in this embodiment the SE detector is a solid state detector—with a detector chip), field-free tube 140, optical axis 190, electron probe 192, first voltage supply 1102, first electrical connectors 1104, second voltage supply 1106 and second electrical connectors 1108 are shown. The SE detector 130 is positioned within the symmetrizing electrode 131, as shown more clearly in FIG. 11B. The symmetrizing electrode 131 is cylindrically symmetric about the optical axis 190, apart from a cut-out for the SE detector 130, and is situated in close proximity to the SE detector—the symmetrizing electrode has the effect of improving the cylindrical symmetry of the detector optics (the combination of the SE detector 130 and the symmetrizing electrode 131 produces a generally cylindrically-symmetric electric field about the optical axis 190. Clearly, this symmetrizing electrode and SE detector combination, and similar embodiments, can also be used to advantage in some of the different detector optics configurations shown in FIGS. 1 through 9. Note that when a symmetrizing electrode is used, as in the embodiment shown in FIG. 11A, the field-free tube 140 will now be screening the electron probe 192 from the electric field due to both the SE detector 130 and the symmetrizing electrode 131.

The electrical connections and voltages applied to the detector optics of FIGS. 11A & 11B are now considered. The symmetrizing electrode 131 is held at a voltage close to that of the SE detector 130; a common voltage supply may be used. For example, the first voltage supply 1102 may be connected to the symmetrizing electrode and the SE detector by first electrical connectors 1104, as shown in FIG. 11B. The substrate 112, substrate electric-field control electrode 120 and the field-free tube 140 are all held at similar voltages; a common voltage supply may be used. For example, second voltage supply 1106 may be connected to the substrate, substrate electric-field control electrode and field-free tube by second electrical connectors 1108, as shown in FIG. 11A.

The combination of the symmetrizing electrode 131 and the SE detector 130, shown in FIGS. 11A and 11B, is now considered in more detail. Referring to FIG. 11B, the symmetrizing electrode 131 is shown to be generally annular—the symmetrizing electrode having a gap for the SE detector 130—with an inner radius approximately equal to the smallest distance between the SE detector 130 and the optical axis 190 and an outer radius approximately equal to the smallest distance between the optical axis 190 and the farthest side (relative to the optical axis) of the SE detector 130. This configuration of the symmetrizing electrode and the SE detector provides a desirable compromise between secondary electron collection efficiency and cylindrical symmetry of the combined electric field about the optical axis (see more detailed discussion below). The spacing between the symmetrizing electrode 131, the field-free tube 140 and the SE detector 130 may be minimized based on avoiding electrical breakdown between any of them (and also taking into account mechanical limits). In certain embodiments (see discussion relating to FIGS. 12A & 12B) close spacing is desired between the field-free tube 140 and the SE detector 130 to allow the detector to collect more of the secondary electrons that travel close to the outer wall of the field-free tube; consequently, in these embodiments close spacing will also be needed between the symmetrizing electrode 131 and the field-free tube 140. Furthermore, the SE detector 130 may be positioned so as to protrude slightly below the plane of the symmetrizing electrode 131, as shown in FIG. 11A—this was found to improve the secondary electron collection efficiency over configurations with the detector either coplanar with or recessed from the symmetrizing electrode; although, the SE detector should not protrude too far below the symmetrizing electrode otherwise: (1) too many secondary electrons may impact the vertical walls of the detector rather than the detector chip 133 located on the lower end of the detector and (2) the symmetrizing electrode will be less effective.

Further consideration is given to design of the symmetrizing electrode 131, an example of which is shown in FIGS. 11A & 11B. The symmetrizing electrode is designed to improve the cylindrical symmetry of the electric field about the optical axis while maintaining a high collection efficiency of secondary electrons by the SE detector. This is achieved by a symmetrizing electrode which: is in close proximity to the SE detector; is centered on the optical axis; is generally annular—with a gap in the annulus where the SE detector is situated; is held at a very similar voltage to the SE detector; does not impinge on the region immediately between the SE detector and the optical axis; and does not impinge on the region extending radially from the optical axis beyond the SE detector. Furthermore, it may be desirable for the symmetrizing electrode to have inner and outer radii substantially equal to the smallest distance to the SE detector and the smallest distance to the farthest side of the SE detector, respectively, as measured from the optical axis.

Referring to FIGS. 12A & 12B, a preferred embodiment of the detector optics is shown with a control electrode assembly which is generally cylindrically-symmetric about the optical axis—the strict cylindrical symmetry of the control electrode assembly is broken by a chamfer on the field-free tube 140 and an offset conical indentation in the top surface of the substrate electric-field control electrode 120. The direction of the offset in the substrate electric-field control electrode (i.e. the X-axis in FIG. 12B) is aligned parallel to the plane containing the largest chamfer angle (e.g. the X-Z plane in FIG. 12A). Furthermore, a symmetrizing electrode 131 is used to offset the asymmetric electric field due to the SE detector 130. This preferred combination results in small distortions of the electron probe 192 which can be satisfactorily corrected with a stigmator 152, as shown in FIG. 1. FIG. 12A is a cross-sectional view of the detector optics in the X-Z plane showing substrate 112, substrate electric-field control electrode 120, SE detector 130, symmetrizing electrode 131, field-free tube 140, optical axis 190 and electron probe 192. FIG. 12B shows a top view of the surface of a conical indentation in the substrate electric-field control electrode 120 showing a circular aperture 126 therethrough. The aperture 126 is concentric with the inner diameter of the field-free tube 140 and is centered on the optical axis 190. The circle 127 represents the intersection of the conical indentation with the top surface of the substrate electric-field control electrode. The axis of the conical indentation is parallel to the optical axis 190 and is offset from the optical axis by the distance between the Y-axis and the axis 121. Note that for this embodiment of the detector optics the preferred scan direction for the electron probe 192 is in a direction parallel to the Y-axis, as shown in FIG. 12B. This directional preference is based on the desirability of keeping the beam as near to the optical axis 190 as possible during scanning. By scanning parallel to the Y-axis, the maximum beam distance from the axis 190 at the substrate surface 112 will be $\sqrt{(\delta Y_{scan}^2 + \delta X_{chamfer\ offset}^2)}$, where $\delta Y_{scan}$ is the maximum scan distance off axis and $\delta X_{chamfer\ offset}$ is the X-axis beam displacement due to the deflection effect of the control electrode asymmetry. If scanning were to be parallel to the X-axis, the maximum beam distance from the axis 190 at the substrate surface 112 would be $\delta X_{scan} + \delta X_{chamfer\ offset}$ which is larger than for a Y-axis scan, since $\delta X_{scan} = \delta Y_{scan}$.

An example of typical set voltages applied to the elements of the detector optics shown in FIGS. 12A & 12B for a 1 keV electron probe 192 are: 1000 V on substrate 112, 986 V on substrate electric-field control electrode 120, 5000 V on SE detector 130, 5000 V on symmetrizing electrode 131, and 986 V on field-free tube 140. These set voltages can be maintained by using voltage supplies as shown in FIGS. 11A & 11B. With these set voltages for the optical elements, a large fraction of the secondary electrons travel close to the outer wall of the field-free tube 140; consequently, it is advantageous for the SE detector 130 and symmetrizing electrode 131 to be positioned as close to the outer wall of the field-free tube as can be achieved without electrical breakdown between the different elements.

Most of the components of the detector optics can be fabricated by precision-machining vacuum-compatible metals, insulating ceramics and conductive ceramics. Standard mechanical and optical alignment techniques are utilized to ensure that all components are properly situated. Most of the discussion above has considered the secondary electron collection efficiency. The detector optics of this invention which includes generally cylindrically-symmetric control electrodes can also be used to decrease the transit time of secondary electrons from the wafer to the SE detectors. As above, the strict cylindrical symmetry of the control electrode assembly is broken by a small adjustment to one control electrode, or small adjustments to several control electrodes.

While the invention has been described with reference to particular embodiments, this description is solely for the purpose of illustration and is not to be construed as limiting the scope of the invention claimed below. For example, the detector optics of this invention can be integrated into a variety of charged particle beam columns, including columns with magnetic lenses. Further, the symmetrizing electrode of this invention can be used to advantage in a variety of imaging systems which have secondary electron detectors. Furthermore, the generally cylindrically symmetric control electrode assembly of this invention can be incorporated into a variety of systems, including electron beam lithography systems, electron microscopes, other analytical systems utilizing electron beams, and analytical and imaging systems utilizing ion beams.

What is claimed is:

1. A charged particle beam column comprising:
    a probe optics assembly, for forming a charged particle probe;
    an optical axis, defined by said probe optics assembly;
    a secondary electron detector situated below said probe optics assembly; and
    a symmetrizing electrode situated in close proximity to said secondary electron detector, said symmetrizing electrode being generally annular in shape, centered on said optical axis, and with a gap where said secondary electron detector is situated.

2. A charged particle beam column as in claim 1, wherein said secondary electron detector protrudes below said symmetrizing electrode.

3. A charged particle beam column as in claim 1, wherein said symmetrizing electrode does not impinge on the region immediately between said secondary electron detector and said optical axis.

4. A charged particle beam column as in claim 1, wherein the outer radius of said symmetrizing electrode is substantially equal to the smallest distance from said optical axis to the farthest side of said secondary electron detector, as measured from said optical axis.

5. A charged particle beam column as in claim 1, wherein said inner radius of said symmetrizing electrode is substantially equal to the nearest distance from said optical axis to said secondary electron detector.

6. A charged particle beam column as in claim 1, further comprising a field-free tube, generally cylindrically-symmetric about said optical axis, the wall of said field-free tube being positioned between said optical axis and the combination of said secondary electron detector and said symmetrizing electrode.

7. A charged particle beam column for examination of a substrate, comprising:
    a probe optics assembly, for forming a charged particle probe;
    an optical axis, defined by said probe optics assembly;
    a secondary electron detector situated below said probe optics assembly;
    a symmetrizing electrode situated in close proximity to said secondary electron detector; and
    a detector voltage supply electrically connected to said symmetrizing electrode and said secondary electron detector, for maintaining said symmetrizing electrode and said detector at similar voltages;
    wherein said symmetrizing electrode and said secondary electron detector are configured to produce a generally cylindrically-symmetric electric field about said optical axis.

8. A charged particle beam column as in claim 7, further comprising a stage situated below said secondary electron detector and said symmetrizing electrode.

9. A charged particle beam column as in claim 7, wherein said probe optics assembly comprises:

a charged particle gun;

an accelerating region situated below said charged particle gun;

scanning deflectors situated below said accelerating region; and a focus electrode and a stigmator situated below said deflectors.

10. A charged particle beam column as in claim 7, further comprising a control electrode assembly, cylindrically-symmetric about said optical axis, situated below said probe optics assembly.

11. A charged particle beam column as in claim 10, wherein said control electrode assembly comprises a field-free tube, the wall of said field-free tube being situated between said optical axis and the combination of said secondary electron detector and said symmetrizing electrode, and a control electrode voltage supply electrically connected to said field-free tube, for maintaining said field-free tube at a set voltage, said field-free tube being configured to reduce the exposure of said charged particle beam to the electric field due to said secondary electron detector and said symmetrizing electrode.

12. A charged particle beam column as in claim 11, wherein said field-free tube is further configured to break said cylindrical symmetry.

13. A charged particle beam column as in claim 11, wherein said symmetrizing electrode and said secondary electron detector are positioned in as close proximity to said field-free tube as mechanically allowable while avoiding electrical breakdown across the gaps between said detector and said field-free tube and said symmetrizing electrode and said field-free tube.

14. A charged particle beam column as in claim 10, wherein said control electrode assembly comprises a substrate electric-field control electrode, situated between said secondary electron detector and said substrate, and a control electrode voltage supply electrically connected to said substrate electric-field control electrode, for maintaining said substrate electric-field control electrode at a set voltage, said substrate electric-field control electrode being configured to control the electric field at the surface of said substrate.

15. A charged particle beam column as in claim 14, wherein said substrate electric-field control electrode is further configured to break said cylindrical symmetry.

16. A charged particle beam column as in claim 14, wherein said substrate electric-field control electrode has (a) an aperture through said electrode, cylindrically-symmetric about said optical axis, and (b) a conical indentation in the top surface of said electrode.

17. A charged particle beam column as in claim 16, wherein the central axis of said conical indentation in the top surface of said substrate electric-field control electrode is contained within said aperture and is offset from the central axis of said aperture.

18. A charged particle beam column as in claim 10, wherein said control electrode assembly comprises:

a field-free tube, the wall of said field-free tube being situated between said optical axis and the combination of said secondary electron detector and said symmetrizing electrode; and a substrate electric-field control electrode situated below said field-free tube, said secondary electron detector and said symmetrizing electrode and immediately above said substrate.

19. A charged particle beam column comprising:

a probe optics assembly, for forming a charged particle probe;

an optical axis, defined by said probe optics assembly;

a secondary electron detector situated below said probe optics assembly; and a substrate electric-field control electrode, generally cylindrically-symmetric about said optical axis, situated between said secondary electron detector and a substrate, said substrate electric-field control electrode having (a) an aperture through said electrode, cylindrically-symmetric about said optical axis, and (b) a conical indentation in the top surface of said electrode;

wherein said conical indentation in the top surface of said electrode is situated on said electrode to break the symmetry of said electrode about said optical axis.

20. A charged particle beam column as in claim 19, wherein the central axis of said conical indentation in the top surface of said substrate electric-field control electrode is contained within said aperture and is offset from the central axis of said aperture.

21. A charged particle beam column as in claim 19, further comprising a field-free tube, generally cylindrically-symmetric about said optical axis, the wall of said field-free tube being situated between said optical axis and said secondary electron detector.

22. A charged particle beam column as in claim 21, wherein said field-free tube has a chamfered lower end.

* * * * *